United States Patent
Choi et al.

(10) Patent No.: US 10,217,640 B2
(45) Date of Patent: Feb. 26, 2019

(54) METHODS OF FABRICATING SEMICONDUCTOR DEVICES

(71) Applicant: Samsung Electronics Co., Ltd., Suwon-si, Gyeonggi-do (KR)

(72) Inventors: Soojung Choi, Seoul (KR); Moonkyun Song, Anyang-si (KR); Yoon Tae Hwang, Seoul (KR); Kyumin Lee, Seoul (KR); Sangjin Hyun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/797,340

(22) Filed: Oct. 30, 2017

(65) Prior Publication Data

US 2018/0151376 A1  May 31, 2018

(30) Foreign Application Priority Data

Nov. 25, 2016 (KR) .................. 10-2016-0158652

(51) Int. Cl.
*H01L 21/28* (2006.01)
*H01L 21/8238* (2006.01)
(Continued)

(52) U.S. Cl.
CPC .. *H01L 21/28185* (2013.01); *H01L 21/28202* (2013.01); *H01L 21/30604* (2013.01); *H01L 21/31053* (2013.01); *H01L 21/31144* (2013.01); *H01L 21/324* (2013.01); *H01L 21/32139* (2013.01); *H01L 21/823814* (2013.01);
(Continued)

(58) Field of Classification Search
CPC ......... H01L 21/28185; H01L 21/28202; H01L 21/30604; H01L 21/31053; H01L 21/311144; H01L 21/32139; H01L 21/324
See application file for complete search history.

(56) References Cited

U.S. PATENT DOCUMENTS 8,357,604 B2  1/2013  Hoentschel et al.
8,592,296 B2  11/2013  Ando et al.
(Continued)

FOREIGN PATENT DOCUMENTS

KR  20120052793 A  5/2012

*Primary Examiner* — Christine Enad
(74) *Attorney, Agent, or Firm* — Harness, Dickey & Pierce, P.L.C.

(57) ABSTRACT

A method of fabricating a semiconductor device includes forming first and second gate dielectric layers on first and second regions of a semiconductor substrate, respectively, forming a first metal-containing layer on the first and second gate dielectric layers, performing a first annealing process with respect to the first metal-containing layer, removing the first metal-containing layer from the first region, forming a second metal-containing layer on an entire surface of the semiconductor substrate, performing a second annealing process with respect to the second metal-containing layer, forming a gate electrode layer on the second metal-containing layer, and partially removing the gate electrode layer, the second metal-containing layer, the first metal-containing layer, the first gate dielectric layer, and the second gate dielectric layer to form first and second gate patterns on the first and second regions, respectively.

19 Claims, 15 Drawing Sheets

(51) Int. Cl.
  *H01L 29/49*    (2006.01)
  *H01L 29/66*    (2006.01)
  *H01L 21/306*   (2006.01)
  *H01L 21/3213*  (2006.01)
  *H01L 21/311*   (2006.01)
  *H01L 21/324*   (2006.01)
  *H01L 27/092*   (2006.01)
  *H01L 29/51*    (2006.01)
  *H01L 21/3105*  (2006.01)

(52) U.S. Cl.
  CPC ........ *H01L 21/823821* (2013.01); *H01L 21/823828* (2013.01); *H01L 21/823857* (2013.01); *H01L 27/0922* (2013.01); *H01L 27/0924* (2013.01); *H01L 29/4958* (2013.01); *H01L 29/4966* (2013.01); *H01L 29/513* (2013.01); *H01L 29/66545* (2013.01)

(56) References Cited

U.S. PATENT DOCUMENTS

| | | | |
|---|---|---|---|
| 8,598,665 | B2 | 12/2013 | Frank et al. |
| 8,778,754 | B2 | 7/2014 | Lin |
| 9,018,710 | B2 | 4/2015 | Lee et al. |
| 9,136,180 | B2 | 9/2015 | Machkaoutsan et al. |
| 2008/0062112 | A1* | 3/2008 | Umezaki .......... G09G 3/342 345/100 |
| 2008/0261366 | A1 | 10/2008 | Jeon et al. |
| 2015/0004783 | A1* | 1/2015 | Lee .......... H01L 21/76843 438/653 |
| 2015/0035073 | A1* | 2/2015 | Ando .......... H01L 21/28229 257/369 |
| 2015/0187763 | A1 | 7/2015 | Kim et al. |
| 2015/0255557 | A1 | 9/2015 | Zhu et al. |
| 2017/0207093 | A1* | 7/2017 | Ho .......... H01L 21/28088 |

* cited by examiner

METHODS OF FABRICATING SEMICONDUCTOR DEVICES

CROSS-REFERENCE TO RELATED APPLICATIONS

This U.S. nonprovisional patent application claims priority under 35 U.S.C. § 119 of Korean Patent Application No. 10-2016-0158652, filed on Nov. 25, 2016, the entire contents of which are hereby incorporated by reference.

BACKGROUND

1. Field

Some example embodiments of the present inventive concepts relate to a method of fabricating a semiconductor device.

2. Description of the Related Art

A semiconductor device has a trend of demanding lower power consumption and higher operating speed as well as higher integration. A CMOS device requires lower threshold voltage for transistors so as to meet the trend. The CMOS device includes an NMOS transistor and a PMOS transistor. The NMOS transistor used N-type polysilicon as a gate electrode, and the PMOS transistor used P-type polysilicon as a gate electrode. However, degradation of drive current due to depletion of polysilicon has been a problem with the advanced fineness of transistors. Accordingly, there are limitations to improve or optimize threshold voltages of NMOS and PMOS transistors.

SUMMARY

Some example embodiments of the present inventive concepts provide a method of fabricating a semiconductor device capable of enhancing reliability and providing CMOS transistors with desired threshold voltages.

According to sonic example embodiments of the present inventive concepts, a method of fabricating a semiconductor device includes forming a first gate dielectric layer and a second gate dielectric layer, respectively, on a first region and a second region that are included in a semiconductor substrate, forming a first metal-containing layer on the first and second gate dielectric layers, performing a first annealing process with respect to the first metal-containing layer, removing the first metal-containing layer from the first region, forming a second metal-containing layer on an entire surface of the semiconductor substrate, performing a second annealing process with respect to the second metal-containing layer, forming a gate electrode layer on the second metal-containing layer, and partially removing the gate electrode layer, the second metal-containing layer, the first metal-containing layer, the first gate dielectric layer, and the second gate dielectric layer to form a first gate pattern and a second gate pattern on the first region and the second region, respectively.

According to some example embodiments of the present inventive concepts, a method of fabricating a semiconductor device includes forming a first gate dielectric layer and a second gate dielectric layer, respectively, on a first region and a second region that are included in a semiconductor substrate, forming a first metal-containing layer on the first and second gate dielectric layers, forming a mask pattern to cover the first metal-containing layer on the first region, performing a first annealing process with respect to the first metal-containing layer exposed through the mask pattern, removing the mask pattern, forming a second metal-containing layer on the first metal-containing layer, performing a second annealing process with respect to the second metal-containing layer, forming a gate electrode layer on the second metal-containing layer, and partially removing the gate electrode layer, the second metal-containing layer, the first metal-containing layer, the first gate dielectric layer, and the second gate dielectric layer to form a first gate pattern and a second gate pattern on the first region and the second region, respectively.

According to some example embodiments of the present inventive concepts, a method of fabricating a semiconductor device includes forming an interlayer dielectric layer on a substrate having a first region and a second region; forming a first groove and a second groove in the interlayer dielectric layer at the first region and the second region, respectively; forming a first metal-containing layer in the first groove and the second groove; performing a first annealing process with respect to the first metal-containing layer; removing the first metal-containing layer in the first groove; forming a second metal-containing layer in the first groove and the second groove; performing a second annealing process with respect to the second metal-containing layer; and partially removing the second metal-containing layer to expose a top surface of the interlayer dielectric layer.

DETAILED DESCRIPTION

It will be hereinafter described in detail some example embodiments of the present inventive concepts in conjunction with the accompanying drawings.

FIGS. 1 to 12 are cross-sectional views illustrating a method of fabricating a semiconductor device having a gate last structure according to some example embodiments of the present inventive concepts.

Figure 1:
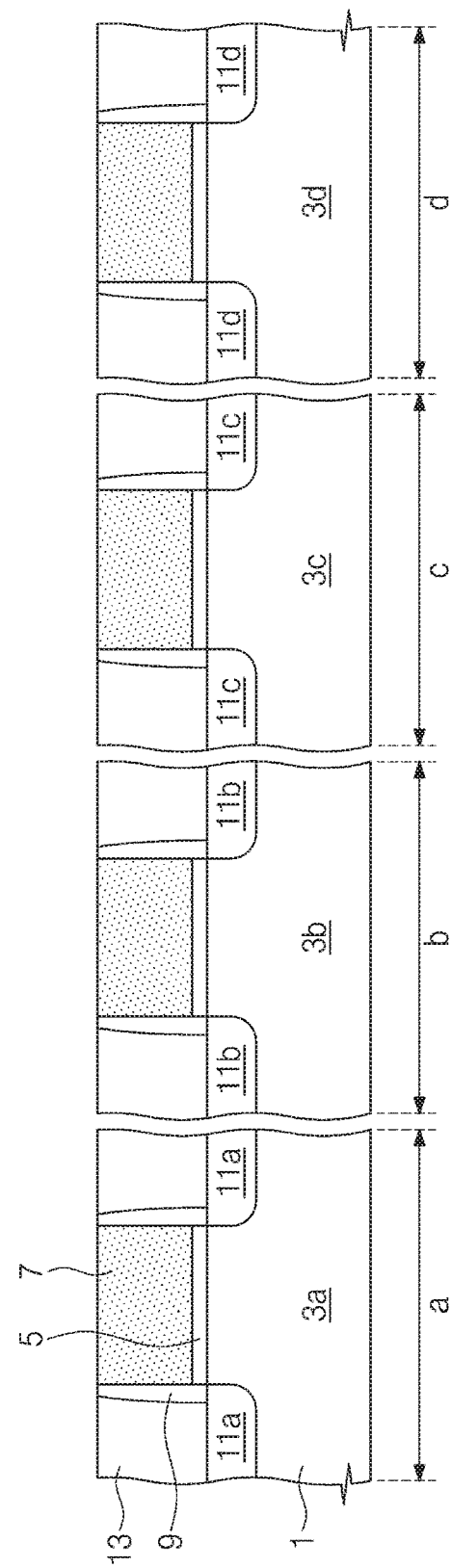
FIGS. 1 to 12 are cross-sectional views illustrating a method of fabricating a semiconductor device having a gate last structure according to some example embodiments of the present inventive concepts.

Referring to FIG. 1, a semiconductor substrate 1 may be prepared to include a first region a, a second region b, a third region c, and a fourth region d. The semiconductor substrate 1 may be, for example, a single crystalline silicon wafer. The first to fourth regions a to d may be regions where transistors are formed to have different threshold voltages from each other. The first to fourth regions a to d may be divided from each other by a device isolation layer (not shown) that is formed in the semiconductor substrate 1. For example, the first region a may be an region for a low-voltage NMOS transistor, and the second region b may be an region for a high-voltage NMOS transistor. For example, the third region c may be a region for a low-voltage PMOS transistor, and the fourth region d may be a region for a high-voltage PMOS transistor. First to fourth well regions 3a to 3d may be formed in the semiconductor substrate 1. When the first and second regions a and b are regions for NMOS transistors, the first and second well regions 3a and 3b may be doped with P-type impurities. When the third and fourth regions c and d are regions for PMOS transistors, the third and fourth well regions 3c and 3d may be doped with N-type impurities.

A dummy gate dielectric layer and a dummy gate layer may be stacked and patterned on the semiconductor substrate 1, and thus a dummy gate dielectric pattern 5 and a dummy gate pattern 7 may be formed on each of the first to fourth regions a to d. The dummy gate dielectric pattern 5 may be formed of, for example, a silicon oxide layer. The dummy gate pattern 7 may be formed of, for example, a silicon nitride layer. FIG. 1 illustrates that the dummy gate patterns 7 have the same horizontal length (i.e., gate width or channel length), but the width may be changed depending on desired characteristics of transistors. For example, a high-voltage transistor may have a gate with greater than that of a low-voltage transistor.

A spacer 9 may be formed to cover sidewalls of the dummy gate pattern 7 and the dummy gate dielectric pattern 5. The spacer 9 may be formed of an insulation layer having an etch selectivity to the dummy gate pattern 7 and the dummy gate dielectric pattern 5. The spacer 9 may be formed to have a single layer or a multiple layer. The semiconductor substrate 1 may experience an ion implantation process that uses the dummy gate patterns 7 as an ion implantation mask to form first to fourth source/drain regions 11a to 11d in the semiconductor substrate 1. When the first and second regions a and b are regions for NMOS transistors, the first and second source/drain regions 11a and 11b may be doped with, for example, N-type impurities. When the third and fourth regions c and d are regions for PMOS transistors, the third and fourth source/drain regions 11c and 11d may be doped with, for example, P-type impurities. Subsequently, an interlayer dielectric layer 13 may be stacked on the semiconductor substrate 1 and then a planarization etch process may be performed to expose top surfaces of the dummy gate patterns 7 and the spacer 9.

Figure 2:
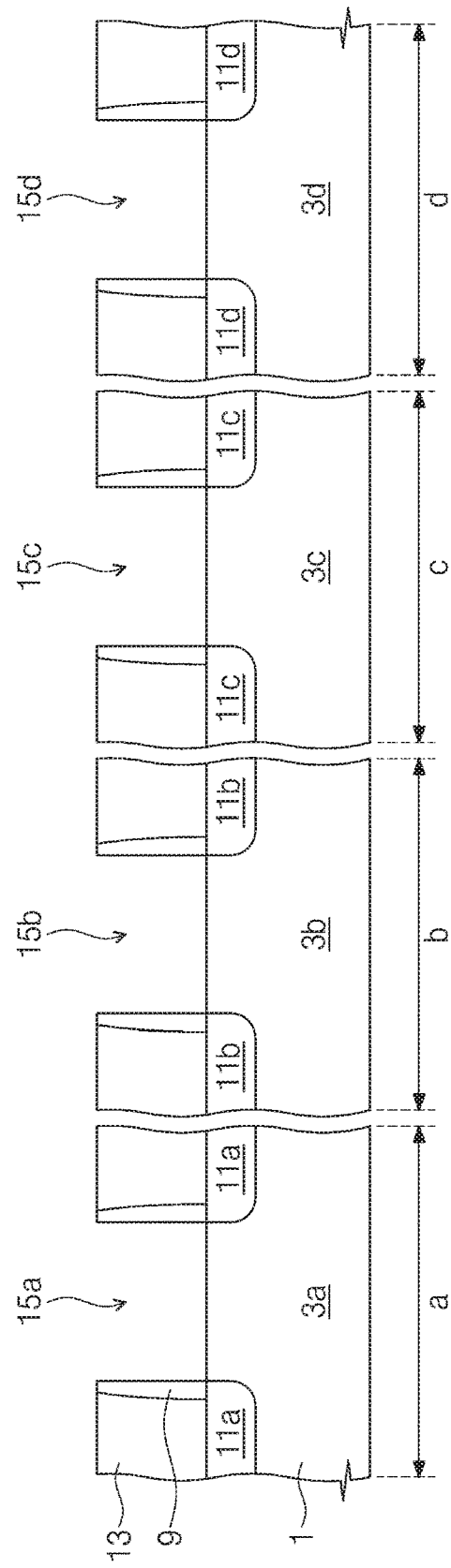

Referring to FIG. 2, the dummy gate patterns 7 and the dummy gate dielectric patterns 5 may be selectively removed to form first to fourth grooves 15a to 15d that expose the semiconductor substrate 1.

Figure 3:
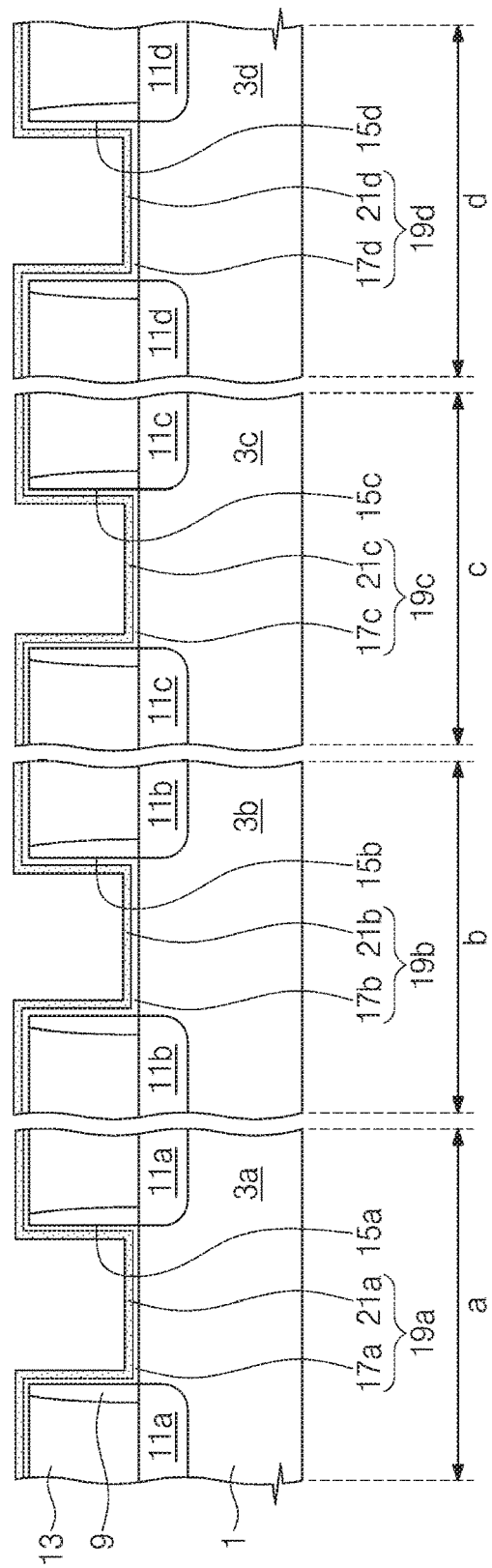

Referring to FIG. 3, first to fourth gate dielectric layers 19a to 19d may be formed on the semiconductor substrate 1. The gate dielectric layers 19a to 19d may include boundary insulation layers 17a to 17d and high-k dielectric layers 21a to 21d. The boundary insulation layers 17a to 17d may improve interface characteristics between the semiconductor substrate 1 and the high-k dielectric layers 21a to 21d, thereby enhancing carrier mobility. At least one of the boundary insulation layers 17a to 17d may be formed of, for example, a silicon oxide layer, which is formed by thermally oxidizing surfaces of the semiconductor substrate 1 that are exposed through the first to fourth grooves 15a to 15d. Alternatively, the boundary insulation layers 17a to 17d may be made of, for example, a silicon oxide layer or a silicon oxynitride layer, which is formed by atomic layer deposition or chemical vapor deposition.

Thicknesses and types of the boundary insulation layers 17a to 17d may be changed based on characteristics of their locations. For example, the second and fourth boundary insulation layers 17b and 17d possibly included in high-voltage transistors may be thicker than the first and third boundary insulation layers 17a and 17c possibly included in low-voltage transistors. The high-k dielectric layers 21a to 21d may have a dielectric constant greater than that (e.g., about 3.9) of a silicon oxide layer. For example, the high-k dielectric layers 21a to 21d may be oxide, nitride, silicide, oxynitride, or silicide oxynitride each including one of hafnium (Hf), aluminum (Al), zirconium (Zr), and lanthanum (La). Thicknesses and types of the high-k dielectric layers 21a to 21d may be the same or different from each other based on characteristics of their locations.

Figure 4:
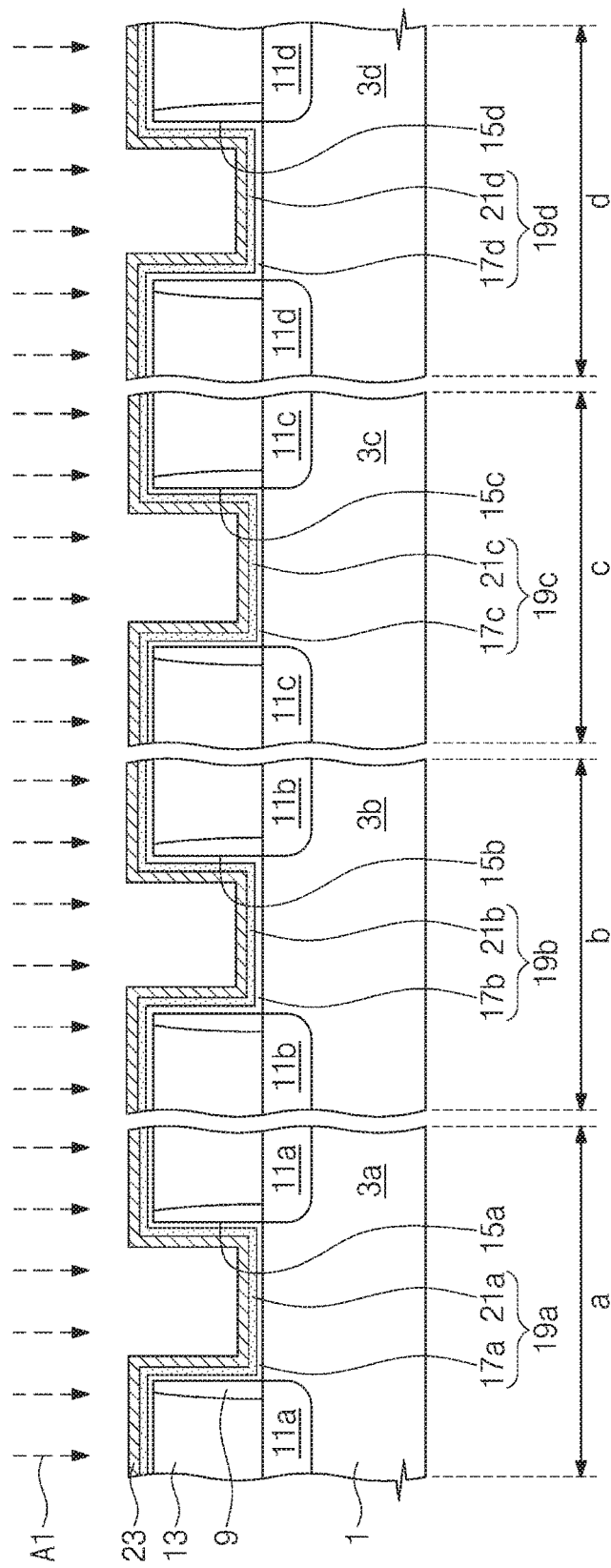

Referring to FIG. 4, a first metal-containing layer 23 may be conformally formed on an entire surface of the semiconductor substrate 1. The first metal-containing layer 23 may be formed to conformally cover floors and sidewalk of the grooves 15a to 15d. The first metal-containing layer 23 may be formed by atomic layer deposition, chemical vapor deposition, etc. The first metal-containing layer 23 may include a titanium nitride (TiN) layer, a tantalum nitride (TaN) layer, a titanium aluminum carbide (TiAlC) layer, an aluminum (Al) layer, or a lanthanum (La) layer. After the first metal-containing layer 23 is formed, a first annealing process A1 may be performed with respect to a surface of the first metal-containing layer 23.

The first annealing process A1 may be carried out by supplying gas that reduces the first metal-containing layer 23. The gas that reduces the first metal-containing layer 23 may be at least one of hydrogen, nitrogen, and ammonia. When the reducing gas is supplied to perform the first annealing process A1, the first metal-containing layer 23 may be reduced due to removal of impurities from inside the first metal-containing layer 23 or removal of an undesired native oxide layer from its surface. It thus may be possible to inhibit or prevent an effective work function of the first metal-containing layer 23 from being undesirably changed due to the native oxide layer or impurities.

When the first annealing process A1 is carried out by supplying the first metal-containing layer 23 with hydrogen or nitrogen, it may be possible to remove nitrogen trapped at interfaces between the first metal-containing layer 23 and the gate dielectric layers 19a to 19d, thereby enhancing reliability of the gate dielectric layers 19a to 19d. This may induce enhancement of NBTI characteristics of transistors which will be later formed.

When the first annealing process A1 is carried out by supplying the first metal-containing layer 23 with ammonia, the ammonia may be decomposed such that nitrogen may diffuse into the first metal-containing layer 23. The nitrogen may then diffuse into the high-k dielectric layers 21a to 21d to fill oxygen vacancies possibly present therein, which may cause an oxygen curing effect. This may reduce leakage current and induce enhancement of PBTI characteristics of transistors which will be later formed.

When the first annealing process A1 reduces the first metal-containing layer 23, a gate electrode may have a reduced effective work function and therefore an increased threshold voltage may be obtained in a PMOS transistor including the gate electrode having the reduced work function. In contrast, a reduced threshold voltage may be obtained in an NMOS transistor including the gate electrode having the reduced effective work function.

In some example embodiments, an effective work function may be a value calculated from a flat band by capacitance-voltage (CV) measurement between a gate electrode and a gate dielectric layer, and may be distinguished from an intrinsic work function of a material constituting a gate electrode.

Alternatively, the first annealing process A1 may be carried out by supplying gas that oxidizes the first metal-containing layer 23. The gas that oxidizes the first metal-containing layer 23 may be one or more of, for example, oxygen ($O_2$), ozone ($O_3$), nitrogen monoxide (NO), and nitrogen dioxide ($NO_2$). When the oxidizing gas is supplied to perform the first annealing process A1 (or heat treatment process), the first metal-containing layer 23 may be oxidized to increase its effective work function. As such, a gate electrode may also have an increased effective work function. A reduced threshold voltage may be obtained in an NMOS transistor including the gate electrode having the increased effective work function. In contrast, an increased threshold voltage may be obtained in an NMOS transistor including the gate electrode having the increased effective work function.

The first annealing process A1 may be carried out at more than about 500° C. As the degree of reduction or oxidation may be changed based on the temperature of the first annealing process A1, the effective work function of the first metal-containing layer 23 may also be changed. It thus may also be possible to adjust threshold voltages of transistors which will be later formed.

When the first annealing process A1 is carried out by supplying a reducing or oxidizing gas, a difference in concentration of nitrogen or oxygen may locally occur in the first metal-containing layer 23.

The first metal-containing layer 23 may have an effective work function that fluctuates in accordance with its thickness. For example, the effective work function of the first metal-containing layer 23 may be lower as the thickness decreases. However, due to limitation of a deposition process, it may be difficult to form the first metal-containing layer 23 having a thickness less than a specific value (e.g., about 8 Å to about 10 Å), and thereby it may also be hard to reduce the effective work function of the first metal-containing layer 23. In the present embodiment, the first annealing process A1 may overcome the limitation describe above and adjust the effective work function of the first metal-containing layer 23. As a result, it may also possible to adjust threshold voltages of transistors which will be later formed.

Figure 5:
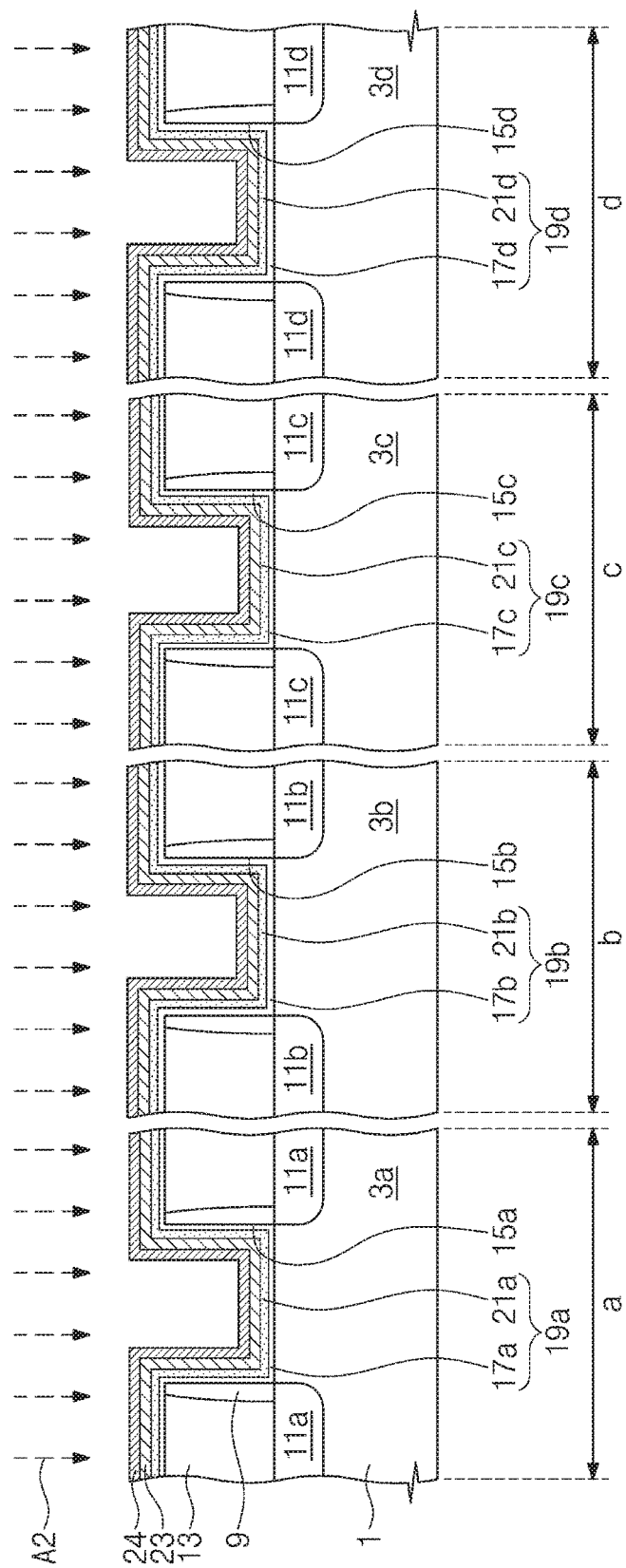

Referring to FIG. 5, a second metal-containing layer 24 may be conformally formed on the entire surface of the semiconductor substrate 1. The second metal-containing layer 24 may include a titanium nitride (TiN) layer, a tantalum nitride (TaN) layer, a titanium aluminum carbide (TiAlC) layer, an aluminum (Al) layer, or a lanthanum (La) layer. The second metal-containing layer 24 may have its thickness and composition the same as or different from those of the first metal-containing layer 23. As an example of a case where the composition is different, even the first and second metal-containing layers 23 and 24 are formed of a titanium nitride layer, one of the first and the second metal-containing layers 23 and 24 may have titanium and nitrogen contents different from those of the other of the first and second metal-containing layers 23 and 24. A second annealing process A2 may be performed with respect to the second metal-containing layer 24. The second annealing process A2 may be carried out by supplying a reducing or oxidizing gas as discussed in the first annealing process A1. The second annealing process A2 may inhibit or prevent an effective work function of the second metal-containing layer 24 from being unusually changed and/or may adjust the effective work function of the second metal-containing layer 24. It therefore may possible to adjust threshold voltages of transistors which will be later formed. When the second annealing process A2 is carried out by supplying a reducing or oxidizing gas, a difference in concentration of nitrogen or oxygen may locally occur in the second metal-containing layer 24.

Figure 6:
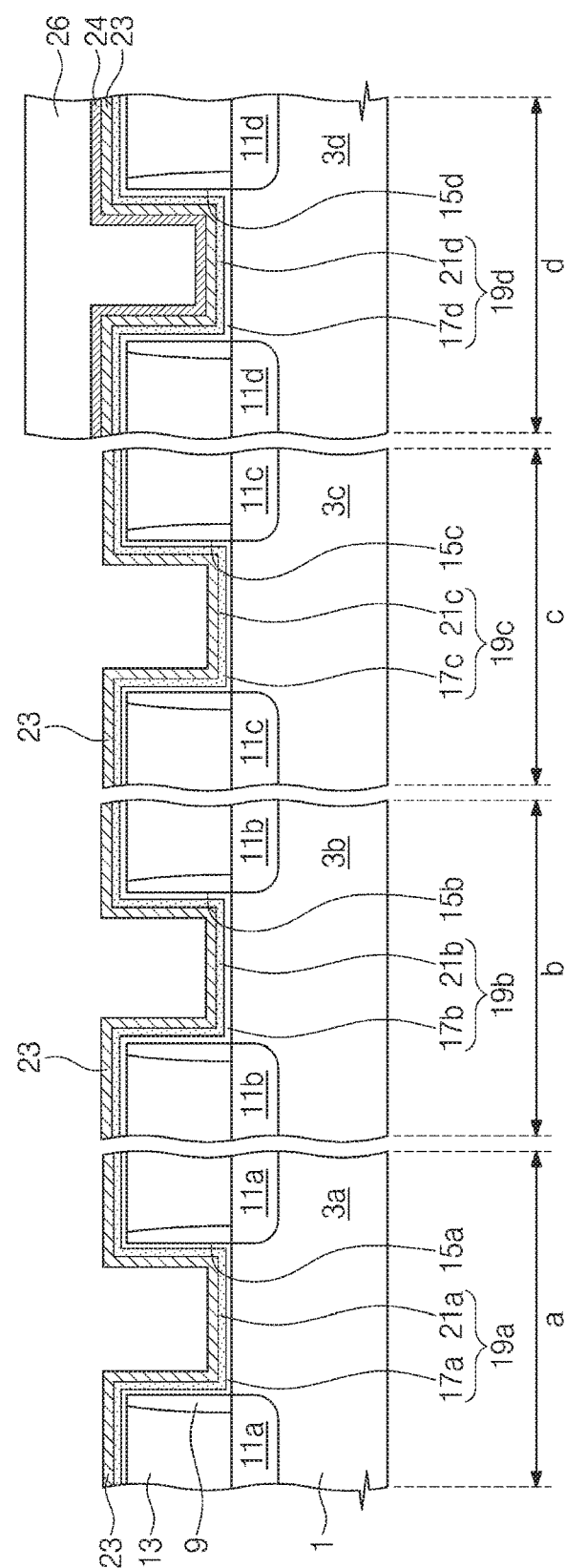

Referring to FIG. 6, a first mask pattern 26 may be formed on the second metal-containing layer 24 to cover the fourth region d while exposing the first to third regions a to c. The first mask pattern 26 may be used as an etch mask to perform, for example, an isotropic etch process to remove the second metal-containing layer 24 exposed on the first to third regions a to c. A subsequent annealing process may be optionally performed.

Figure 7:
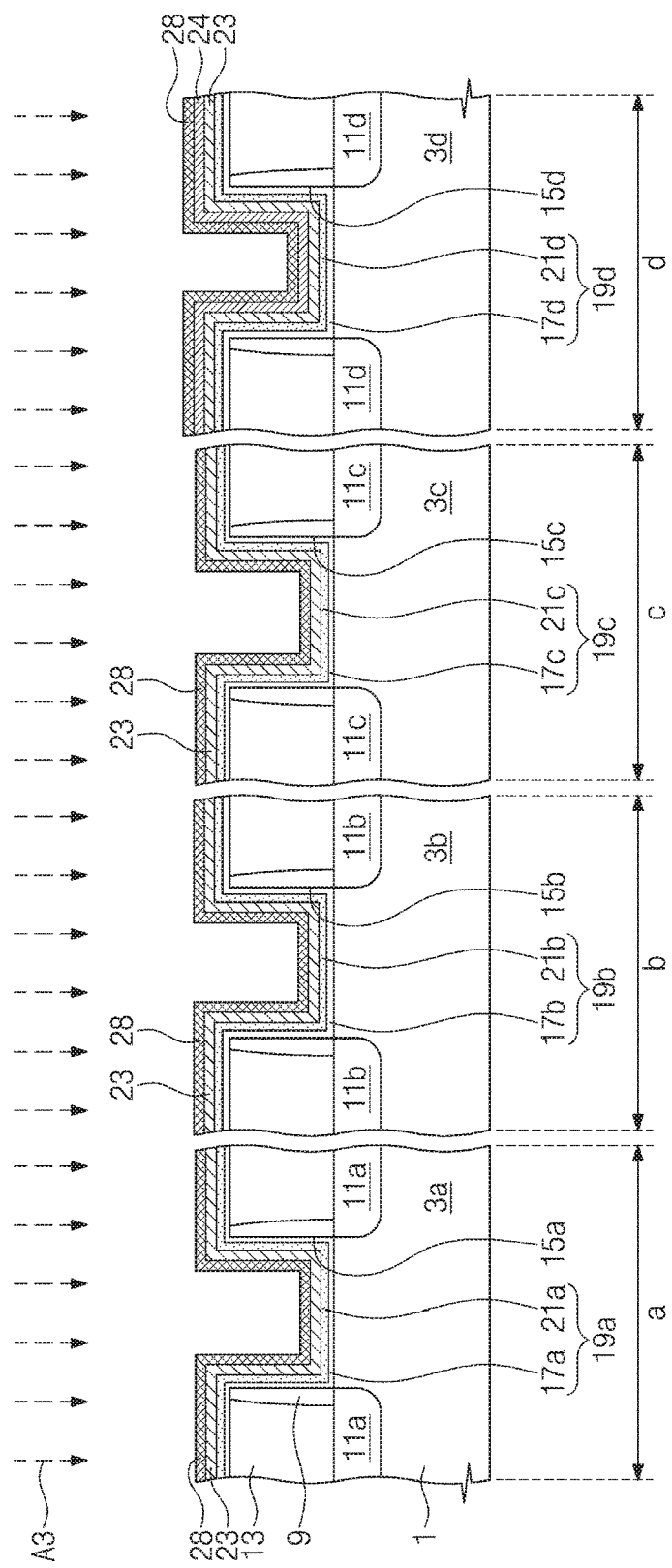

Referring to FIG. 7, the first mask pattern 26 may be removed. A third metal-containing layer 28 may be conformally formed on the entire surface of the semiconductor substrate 1. The third metal-containing layer 28 may include a titanium nitride (TiN) layer, a tantalum nitride (TaN) layer, a titanium aluminum carbide (TiAlC) layer, an aluminum (Al) layer, or a lanthanum (La) layer. The third metal-containing layer 28 may have its thickness and composition the same as or different from those of the first and second metal-containing layers 23 and 24. A third annealing process A3 may be performed with respect to the third metal-containing layer 28. The third annealing process A3 may be carried out by supplying a reducing or oxidizing gas as discussed in the first annealing process A1. The third annealing process A3 may inhibit or prevent undesired changes in an effective work function of the third metal-containing layer 28 and/or may adjust the effective work function of the third metal-containing layer 28. It therefore may possible to adjust threshold voltages of transistors which will be later formed. When the third annealing process A3 is carried out by supplying a reducing or oxidizing gas, a difference in concentration of nitrogen or oxygen may locally occur in the third metal-containing layer 28.

Figure 8:
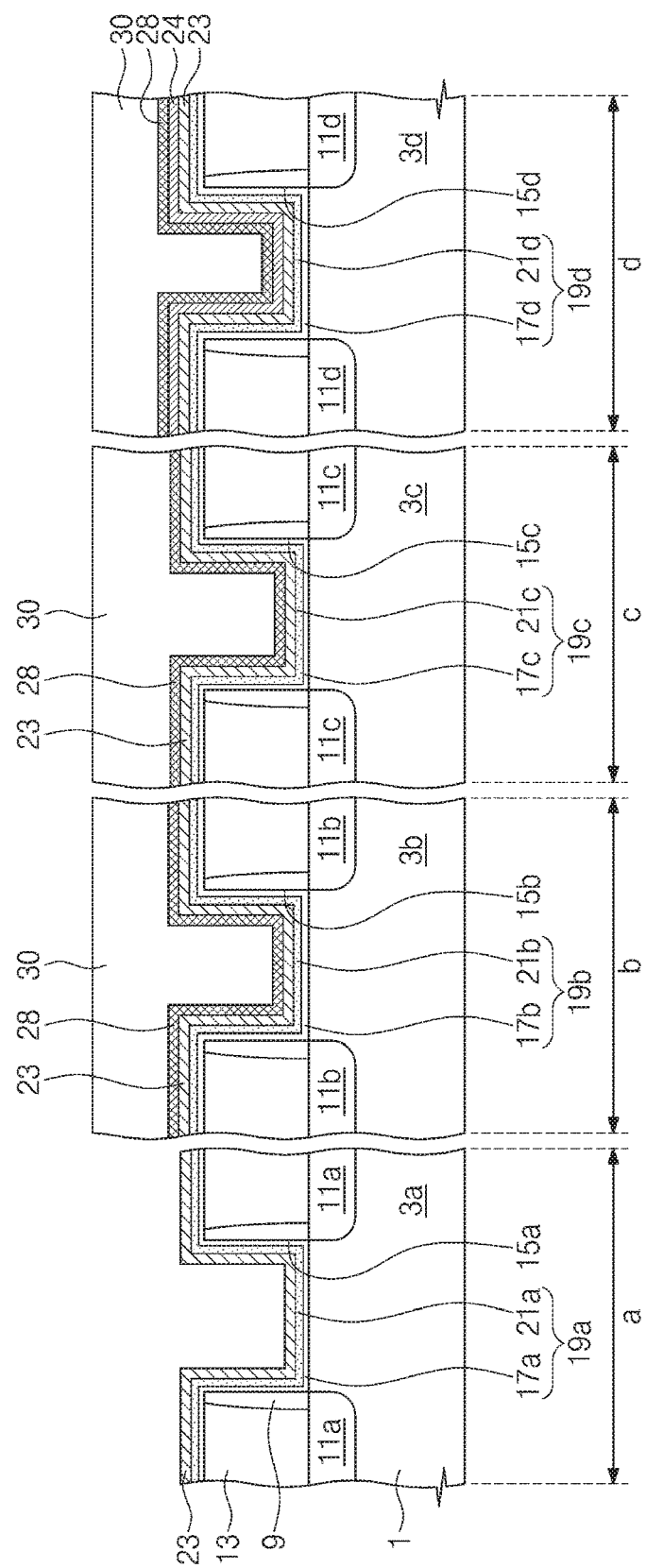

Referring to FIG. 8, a second mask pattern 30 may be formed on the third metal-containing layer 28 to cover the second to fourth regions b to d while exposing the first region a. The second mask pattern 30 may be used as an etch mask to perform, for example, an isotropic etch process to remove the third metal-containing layer 28 exposed on the first region a. A subsequent annealing process may be optionally performed.

Figure 9:
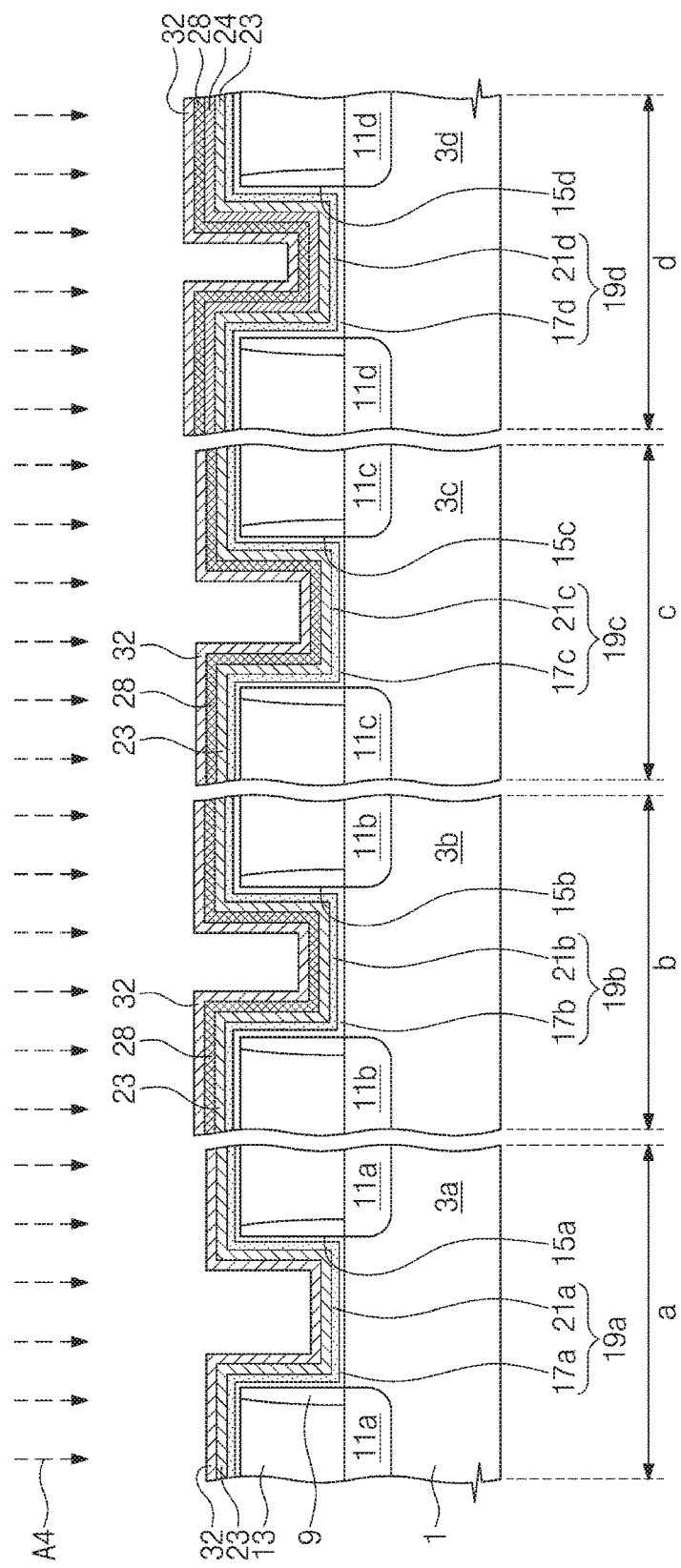

Referring to FIG. 9, the third mask pattern 30 may be removed. A fourth metal-containing layer 32 may be conformally formed on the entire surface of the semiconductor substrate 1. The fourth metal-containing layer 32 may include a titanium nitride (TiN) layer, a tantalum nitride (TaN) layer, a titanium aluminum carbide (TiAlC) layer, an aluminum (Al) layer, or a lanthanum (La) layer. The fourth metal-containing layer 32 may have its thickness and composition the same as or different from those of the first, second, and third metal-containing layers 23, 24, and 28. A fourth annealing process A4 may be performed with respect to the fourth metal-containing layer 32. The fourth annealing process A4 may be carried out by supplying a reducing or oxidizing gas as discussed in the first annealing process A1. The fourth annealing process A4 may inhibit or prevent an effective work function of the fourth metal-containing layer 32 from being unusually changed and/or may adjust the effective work function of the fourth metal-containing layer 32. It therefore may possible to adjust threshold voltages of transistors which will be later formed. When the fourth annealing process A4 is carried out by supplying a reducing or oxidizing gas, a difference in concentration of nitrogen or oxygen may locally occur in the fourth metal-containing layer 32.

Figure 10:
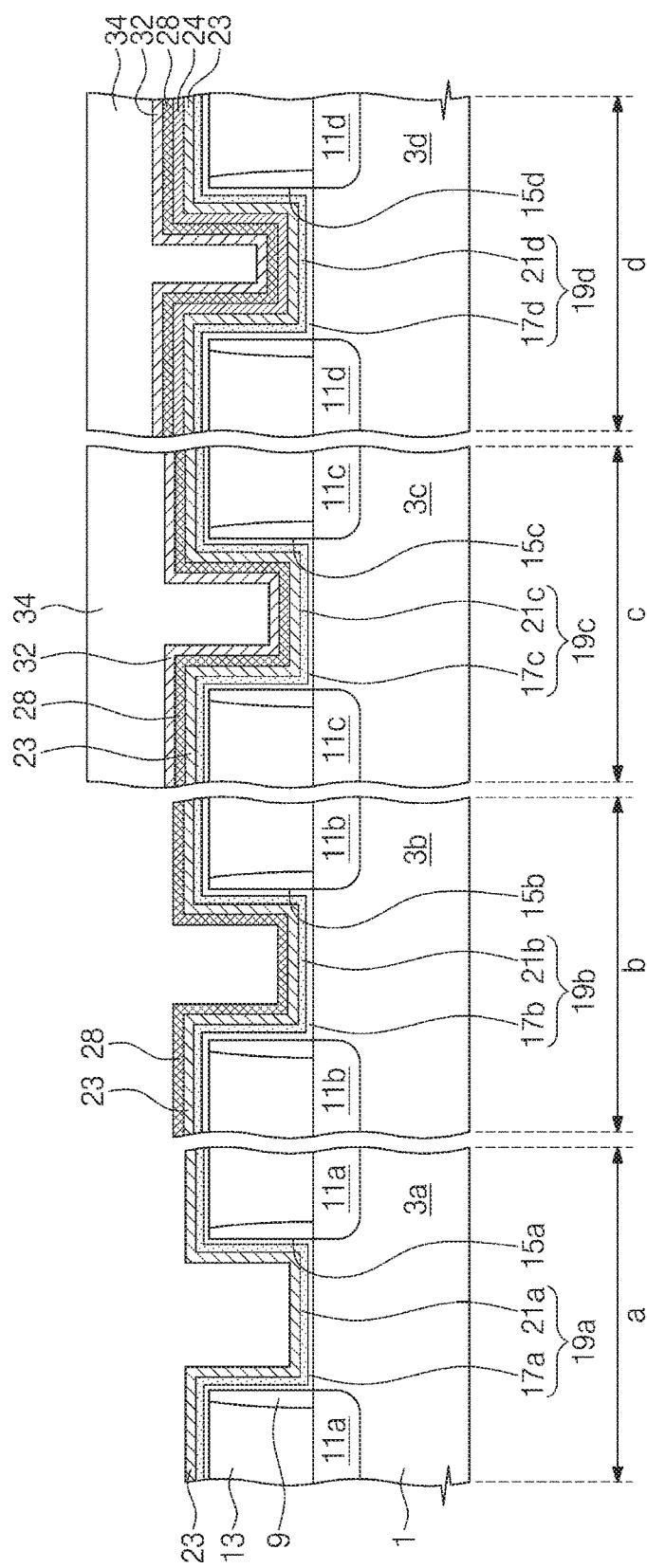

Referring to FIG. 10, a third mask pattern 34 may be formed on the fourth metal-containing layer 32 to cover the third and fourth regions c and d while exposing the first and second regions a and b. The third mask pattern 34 may be used as an etch mask to perform, for example, an isotropic etch process to remove the fourth metal-containing layer 32 exposed on the first and second regions a and b. A subsequent annealing process may be optionally performed. Through the processes above, the first region a may be provided thereon with the first metal-containing layer 23 disposed in the first groove 15a and the second and third metal-containing layers 23 and 28 disposed in the second groove 15b. The first, third, and fourth metal-containing layers 23, 28, and 34 may be disposed in the third groove 15c, and the first, second, third, and fourth metal-containing layers 23, 24, 28, and 32 may be disposed in the fourth groove 15d.

Figure 11:
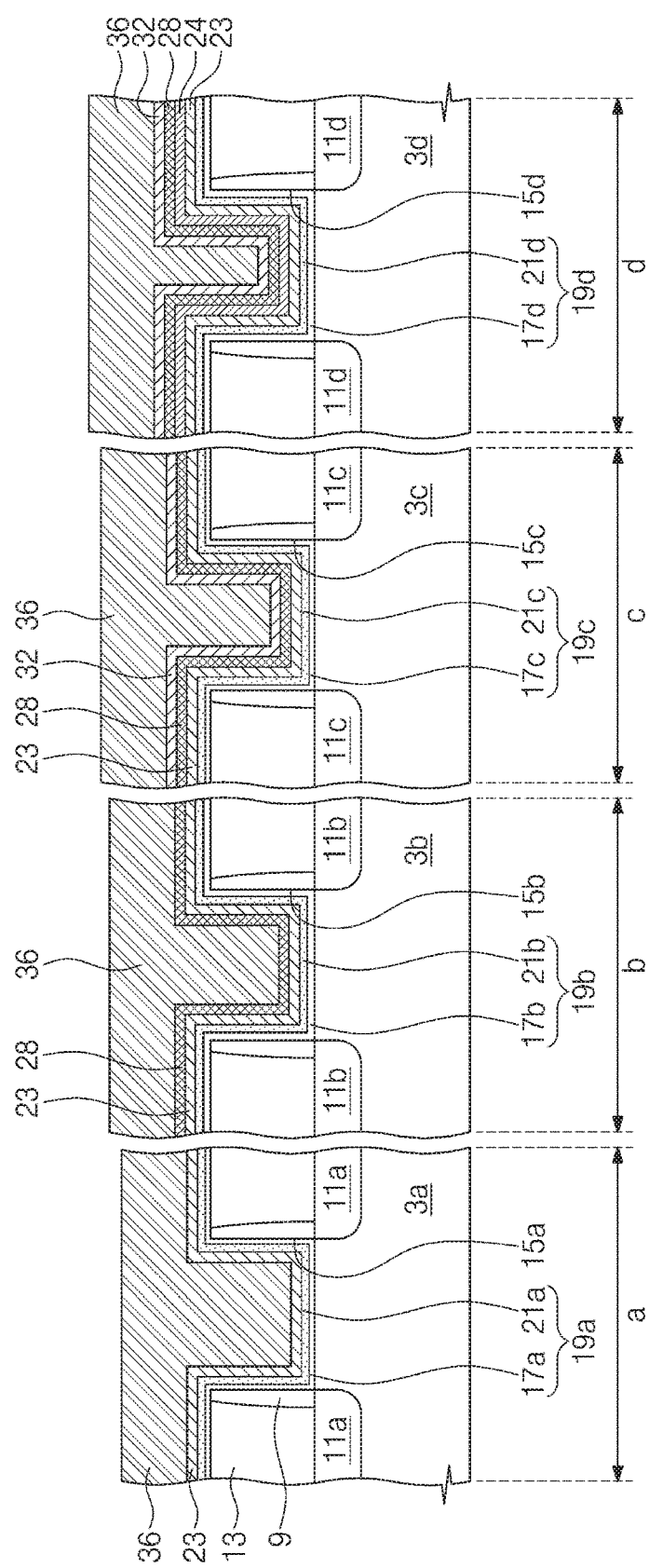

Referring to FIG. 11, the third mask pattern 34 may be removed. After that, the semiconductor substrate 1 may be provided on its entire surface with a gate conductive layer 36 that is formed to fill the first to fourth grooves 15a to 15d. In order to enhance signal transfer speeds of gate electrode lines which will be later formed, the gate conductive layer 36 may be formed of a material having relatively low electrical resistance. For example, the gate conductive layer 36 may include tungsten.

Figure 12:
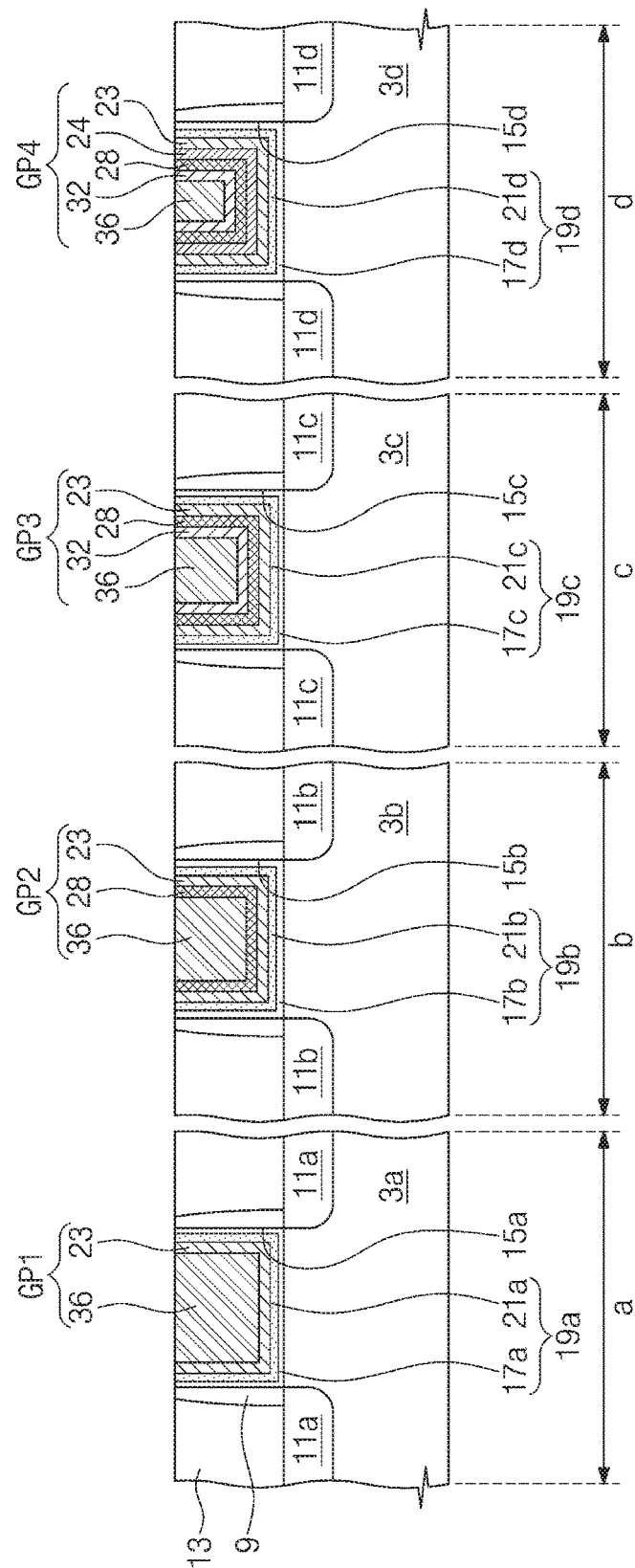

Referring to FIG. 12, the gate conductive layer 36 and the first to fourth metal-containing layers 23, 24, 28, and 32 may undergo a planarization process to form first to fourth gate electrodes GP1 to GP4 respectively disposed in the first to fourth grooves 15a to 15d and expose top surfaces of the interlayer dielectric layer 13 and the spacer 9. The first gate electrode GP1 may include the first metal-containing layer 23 and the gate conductive layer 36. The second gate electrode GP2 may include the first metal-containing layer 23, the third metal-containing layer 28, and the gate conductive layer 36. The third gate electrode GP3 may include the first metal-containing layer 23, the third metal-containing layer 28, the fourth metal-containing layer 32, and the gate conductive layer 36. The fourth gate electrode GP4 may include the first to fourth metal-containing layers 23, 24, and 32 and the gate conductive layer 36. As at least one of the first to fourth metal-containing layers 23, 24, 28, and 32 are included to make the gate electrodes GP1 to GP4 have distinguished structural differences, the gate electrodes GP1 to GP4 may have total effective work functions different from each other and thus have dissimilar threshold voltages. Even though the first to fourth metal-containing layers 23, 24, 28, and 32 are made of a material having the same composition, there may be a difference in thickness of the metal containing layers 23, 24, 28, and 32 included in the gate electrodes GP1 to GP4 such that their total work functions are different from each other. Transistors each including one of the gate electrodes GP1 to GP4 may constitute memory elements such SRAM or CMOS elements of peripheral circuits.

In a semiconductor device shown in FIG. 12, a difference in concentration of nitrogen or oxygen may occur in each of the first to fourth metal-containing layers 23, 24, and 32. In other words, each of the first to fourth metal-containing layers 23, 24, 28, and 32 may have a higher concentration of nitrogen or oxygen at its upper portion than at its lower portion.

According to the present inventive concepts, an annealing process may be performed every time when or after each of the metal-containing layers 23, 24, 28, and 32 is formed. As such, an effective work function of each of the metal-containing layers 23, 24, 28 and 32 may be adjusted and inhibited or prevented from being undesirably changed due to the native oxide layer or impurities.

It has been actually observed changes in characteristics of a semiconductor device achieved by a fabrication method according to some example embodiments of the present inventive concepts.

As one example, the aforementioned process was used to fabricate a plurality of NMOS transistors including titanium nitride layers as metal-containing layers. Nitrogen or hydrogen as a reducing gas was supplied to perform an annealing process every time after each of the titanium nitride layers was formed. As a result of measuring threshold voltages of the NMOS transistors, the threshold voltages were less than the case where the annealing process was not performed at all.

As another example, the aforementioned process was used to fabricate a plurality of NMOS transistors including titanium nitride layers as metal-containing layers, and then ammonia as a reducing gas was supplied to perform an annealing process every time after each of the titanium nitride layers was formed. In this case, compared with the case the annealing process was not performed at all, improved reliability indices, PBTI (Positive Bias Temperature instability) and TDDB (Time Dependent Dielectric Breakdown) indices, and decreased threshold voltages of the NMOS transistors were obtained.

As yet another example, the aforementioned process was used to fabricate a plurality of NMOS transistors including titanium nitride layers as metal-containing layers, and then ammonia was supplied to perform an annealing process every time after forming each of the titanium nitride layers. In this case, it was observed how the threshold voltage varies with changing an annealing temperature from about 550° C. to about 650° C. It was resultantly found that the threshold voltage of the NMOS transistor decreased with increasing temperature from about 550° C. to about 650° C.

As still another example, the aforementioned processes was used to fabricate a plurality of PMOS transistors including titanium nitride layers as metal-containing layers. Nitrogen or hydrogen was supplied to perform an annealing process every time after each of the titanium nitride layers was formed. As a result of measuring threshold voltages of the PMOS transistors, the threshold voltages were less than the case where the annealing process was not performed at all. In this case, it was obtained an improved NBTI (Negative Bias Temperature Instability) index, which is one of reliability indices.

As even still another example, the aforementioned process was used to fabricate a plurality of PMOS transistors including titanium nitride layers as metal-containing layers, and then ammonia was supplied to perform an annealing process each time after forming each of the titanium nitride layers. In this case, it was observed how the threshold voltage varies with changing an annealing temperature from about 550° C. to about 650° C. It was resultantly found that the threshold voltages increased with increasing the temperature from about 550° C. to about 650° C.

Figure 13:
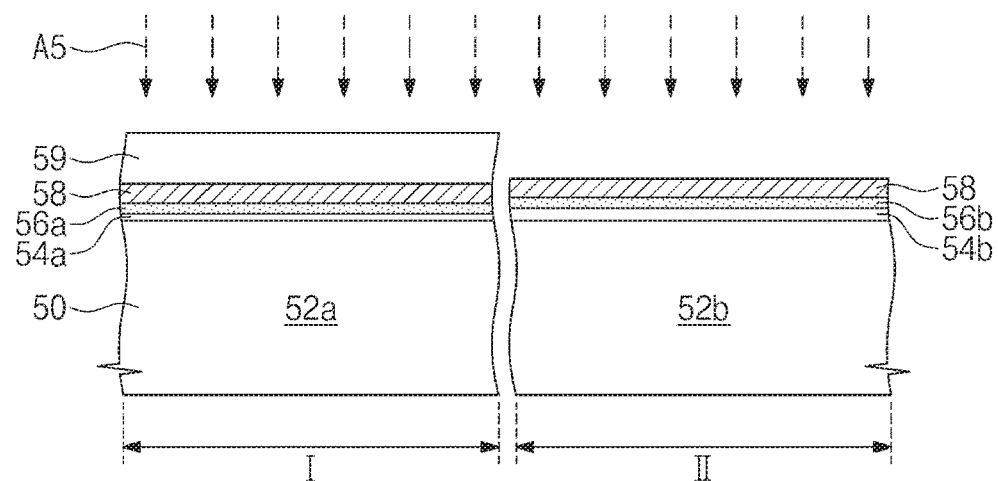
FIGS. 13 to 15 are cross-sectional views illustrating a method of fabricating a semiconductor device having a gate first structure according to some example embodiments of the present inventive concepts.
Figure 14:
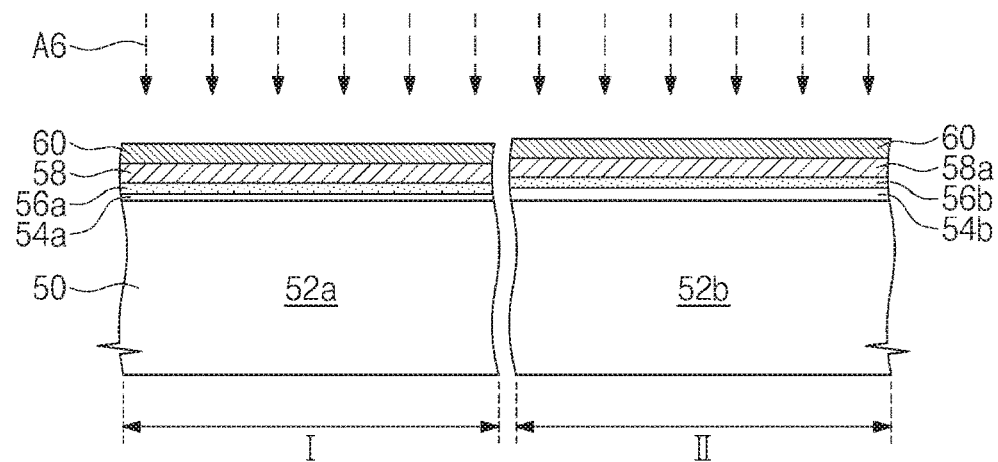
Figure 15:
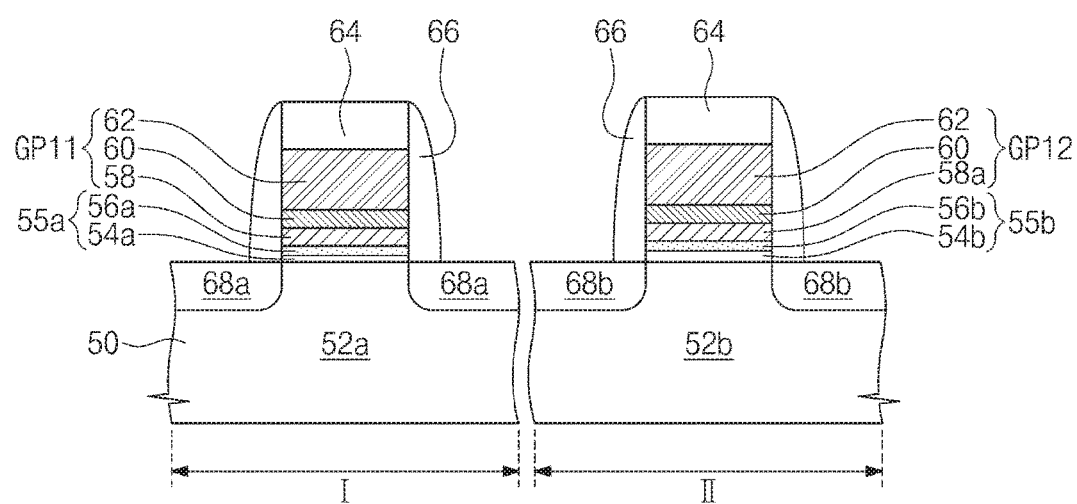

FIGS. 13 to 15 are cross-sectional views illustrating a method of fabricating a semiconductor device having a gate first structure according to some example embodiments of the present inventive concepts.

Referring to FIG. 13, a semiconductor substrate 50 may be prepared to include a first region I and a second region II. A device isolation layer (not shown) may be formed on the semiconductor substrate 50 to separate the first and second regions I and II from each other and to define an active region (not shown) on each of the first and second regions I and II. A first well region 52a may be formed in the semiconductor substrate 50 on the first region I. A second well region 52b may be formed in the semiconductor substrate 50 on the second region II. For example, the first region I may be an NMOS region, and the first well region 52a may be doped with P-type impurities. The second region II may be a PMOS region, and the second well region 52b may be doped with N-type impurities.

A first boundary insulation layer 54a and a first high-k dielectric layer 56a may be sequentially formed on the semiconductor substrate 50 on the first region I. A second boundary insulation layer 54b and a second high-k dielectric layer 56b may be sequentially formed on the semiconductor substrate 50 on the second region II. The first and second boundary insulation layers 54a and 54b and the first and second high-k dielectric layers 56a and 56b may be identical or similar to those discussed with reference to FIG. 3. A first metal-containing layer 58 may be formed on an entire surface of the semiconductor substrate 50. The first metal-containing layer 58 may include a titanium nitride (TiN) layer, a tantalum nitride (TaN) layer, a titanium aluminum carbide (TiAlC) layer, an aluminum (Al) layer, or a lanthanum (La) layer. A mask pattern 59 may be formed on the first metal-containing layer 58 on the first region I. A first annealing process A5 may be performed with respect to the first metal-containing layer 58 exposed through the mask pattern 59.

Referring to FIGS. 13 and 14, when the first annealing process A5 is performed, the first metal-containing layer 58 may be exposed to a reducing or oxidizing gas on the second region II but not on the first region I, and thus, a concentration of nitrogen or oxygen in the first metal-containing layer 58a on the second region II may be different from that in the first metal-containing layer 58 on the first region I. The mask pattern 59 may be removed from the first region I to expose the first metal-containing layer 58. A second metal-containing layer 60 may be formed on the first metal-containing layer 58 and 58a. The second metal-containing layer 60 may include a titanium nitride (TiN) layer, a tantalum nitride (TaN) layer, a titanium aluminum carbide (TiAlC) layer, an aluminum (Al) layer, or a lanthanum (La) layer. The second metal-containing layer 60 may have its thickness and composition which are the same as or different from those of the first metal-containing layer 58. A second annealing process A6 may be performed with respect to the second metal-containing layer 60. The first and second annealing processes A5 and A6 may be identical or similar to those discussed with reference to FIGS. 4 to 11. Herein, a reference numeral 58a is used to designate the first metal-containing layer that has been exposed to the gas of the first annealing process A5.

Referring to FIG. 15, a gate conductive layer 62 may be formed on the second metal-containing layer 60. A capping pattern 64 may be formed on the gate conductive layer 62. The capping pattern 64 may be used as an etch mask to sequentially etch the gate conductive layer 62, the first and second metal-containing layers 58/58a and 60, the first and second high-k dielectric layers 56a and 56b, and the first and second boundary insulation layers 54a and 54b, so that a first gate electrode GP11 may be formed on the first region I and a second gate electrode GP12 may be formed on the second region II. Spacer 66 may be formed to cover opposite sidewalls of each of the first and second gate electrodes GP11 and GP12. An ion implantation process may be performed to form a first source/drain region 68a in the semiconductor substrate 50 adjacent to the first gate electrode GP11. When the first region I is an NMOS region, the first source/drain region 68a may be doped with, for example, N-type impurities. An ion implantation process may be performed to form a second source/drain region 68b in the semiconductor substrate 50 adjacent to the second gate electrode GP12. When the second region II is a PMOS region, the second source/drain region 68b may be doped with, for example, P-type impurities.

In a semiconductor device shown in FIG. 15, the first gate electrode GP11 may include the first metal-containing layer 58 not exposed to the gas of the first annealing process A5 of FIG. 13, and the second gate electrode GP12 may include the first metal-containing layer 58a exposed to the gas of the first annealing process A5. A concentration of nitrogen or oxygen in the first metal-containing layer 58a exposed to the gas of the first annealing process A5 may be different from that in the first metal-containing layer 58 not exposed to the gas of the first annealing process A5.

Figure 16:
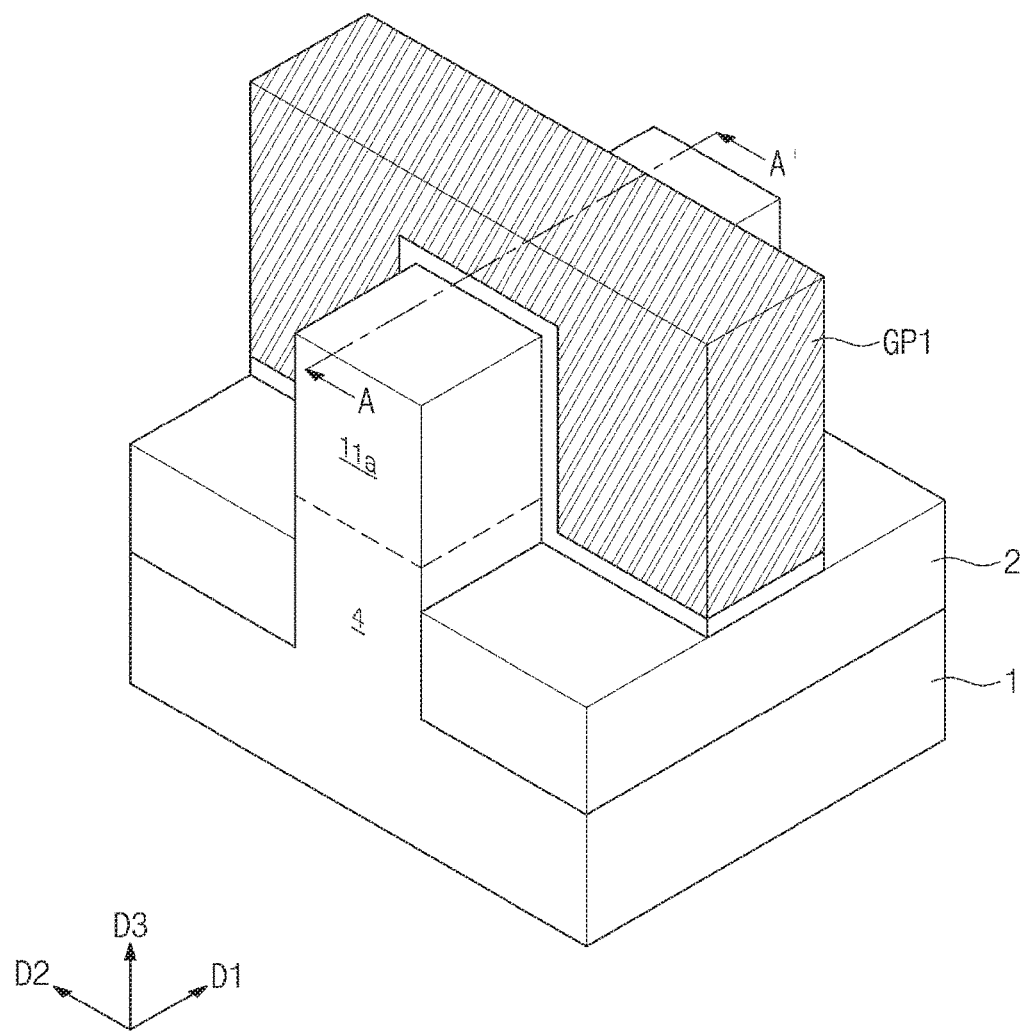
FIG. 16 is a perspective view illustrating a method of fabricating a semiconductor device having a FinFET structure according to some example embodiments of the present inventive concepts.

FIG. 16 is a perspective view illustrating a method of fabricating a semiconductor device having a FinFET structure according to some example embodiments of the present inventive concepts.

Referring to FIG. 16, a semiconductor substrate 1 may be provided therein with a device isolation layer 2 defining an active fin 4, and an upper portion of the device isolation layer 2 may be removed (or recessed) to allow the active fin 4 to protrude above a top surface of the device isolation layer 2. For example, the active fin 4 may be formed to have a bar shape elongated in a first direction D1. Thereafter, as discussed with reference to FIGS. 1 to 12, a semiconductor device may be fabricated to have a gate last structure. Alternatively, as discussed with reference to FIGS. 13 to 15, a semiconductor device may be fabricated to have a gate first structure. Gate dielectric layers 19a, 19b, 19c, 19d, 55a, and 55b and gate electrodes GP1, GP2, GP3, GP4, GP11, and GP12 may extend in a second direction D2 crossing the first direction D1 and be formed to cover top and side surfaces of the active fin 4. Source/drain regions 11a, 11b, 11c, 11d, 68a, and 68b may be disposed in the active fin 4 on opposite sides of each of the gate electrodes GP1, GP2, GP3, GP4, GP11, and GP12. FIGS. 12 and 15 may correspond to a cross-sectional view taken along line A-A' of FIG. 16.

In a method of fabricating a semiconductor device, an annealing process may be performed every time after forming each of the metal-containing layers that are included in a gate pattern. It may thus be possible to inhibit or prevent an effective work function from increasing due to a native oxide layer being formed on the metal-containing layer, and thereby to inhibit or prevent a threshold voltage from being undesirably changed. In the present method, when an annealing process is performed by supplying gas that oxidizes the metal-containing layer, the metal-containing layer may have an increased effective work function. In the present method, an annealing process temperature may be controlled to adjust a threshold voltage of a transistor which will be later formed. In the present method, a type of gas used in the annealing process may be suitably selected to adjust threshold voltages of PMOS and NMOS transistors and to improve reliability indices such as PBTI (Positive Bias Temperature Instability), NBTI (Negative Bias Temperature Instability), and TDDB (Time Dependent Dielectric Breakdown).

Described are methods of fabricating semiconductor devices according to some example embodiments of the present inventive concepts, but the present inventive concepts are not limited thereto. Steps and orders disclosed in the present methods may be combined with each other.

What is claimed is:

1. A method of fabricating a semiconductor device, the method comprising:
    forming a first gate dielectric layer and a second gate dielectric layer on a first region and a second region included in a semiconductor substrate, respectively;

forming a first metal-containing layer on the first and second gate dielectric layers;
performing a first annealing process with respect to the first metal-containing layer;
removing the first metal-containing layer from the first region;
forming a second metal-containing layer on an entire surface of the semiconductor substrate;
performing a second annealing process with respect to the second metal-containing layer;
forming a gate electrode layer on the second metal-containing layer;
partially removing the gate electrode layer, the second metal-containing layer, the first metal-containing layer, the first gate dielectric layer, and the second gate dielectric layer to form a first gate pattern and a second gate pattern on the first region and the second region, respectively; and
performing a third annealing process after the removing the first metal-containing layer from the first region and before the forming the second metal-containing layer.

2. The method of claim 1, wherein at least one of the first and second gate dielectric layers comprises a high-k dielectric layer having a dielectric constant greater than a dielectric constant of a silicon oxide layer.

3. The method of claim 1, wherein
the first annealing process includes supplying gas to reduce or oxidize the first metal-containing layer, and
the second annealing process includes supplying gas to reduce or oxidize the second metal-containing layer.

4. The method of claim 3, wherein
the gas reducing the first and second metal-containing layers comprises at least one of hydrogen ($H_2$), nitrogen ($N_2$), and ammonia ($NH_3$), and
the gas oxidizing the first and second metal-containing layers comprises at least one of oxygen ($O_2$), ozone ($O_3$), nitrogen monoxide (NO), and nitrogen dioxide ($NO_2$).

5. The method of claim 1, wherein
the first region is an NMOS transistor region,
the second region is a PMOS transistor region,
the first annealing process includes supplying at least one of nitrogen and oxygen, and
the second annealing process includes supplying ammonia.

6. The method of claim 5, further comprising:
forming a mask pattern on the second metal-containing layer to cover the second region and to expose the first region before the performing a second annealing process.

7. The method of claim 1, further comprising:
forming a third metal-containing layer on the semiconductor substrate; and
performing the third annealing process with respect to the third metal-containing layer before the forming a gate electrode layer,
wherein at least one of the first and second gate patterns further comprises the third metal-containing layer.

8. The method of claim 1, further comprising:
forming a first dummy gate pattern in contact with the semiconductor substrate on the first region, a second dummy gate pattern in contact with the semiconductor substrate on the second region, and an interlayer dielectric layer in contact with sidewalls of the first and second dummy gate patterns; and
removing the first and second dummy gate patterns to form a first gate groove and a second gate groove each of which exposes the semiconductor substrate before the forming first and second gate dielectric layers,
wherein the forming first and second gate patterns comprises exposing a top surface of the interlayer dielectric layer by performing a planarization process with respect to the gate electrode layer, the second metal-containing layer, the first metal-containing layer, the first gate dielectric layer, and the second gate dielectric layer,
wherein the first gate pattern and the second gate pattern are formed in the first gate groove and the second gate groove, respectively.

9. The method of claim 1, further comprising:
patterning the semiconductor substrate to form a first fin and a second fin on the first region and the second region, respectively, before the forming first and second gate dielectric layers,
wherein the first and second gate dielectric layers surround the first and second fins, respectively.

10. The method of claim 1, wherein the forming first and second gate dielectric layers comprises anisotropically etching the gate electrode layer, the second metal-containing layer, the first metal-containing layer, the first gate dielectric layer, and the second gate dielectric layer using a mask pattern defining the first and second gate patterns.

11. The method of claim 1, further comprising:
forming first source/drain regions in the semiconductor substrate on opposite sides of the first gate pattern; and
forming second source/drain regions in the semiconductor substrate on opposite sides of the second gate pattern,
wherein
the first gate pattern and the first source/drain regions constitute a first transistor,
the second gate pattern and the second source/drain regions constitute a second transistor, and
temperatures of the first and second annealing processes are controlled to adjust threshold voltages of the first and second transistors.

12. The method of claim 1, further comprising:
forming first source/drain regions in the semiconductor substrate on opposite sides of the first gate pattern; and
forming second source/drain regions in the semiconductor substrate on opposite sides of the second gate pattern,
wherein
the first gate pattern and the first source/drain regions constitute a first transistor,
the second gate pattern and the second source/drain regions constitute a second transistor, and
types of gases supplied in the first and second annealing processes are controlled to adjust threshold voltages of the first and second transistors.

13. The method of claim 1, further comprising:
forming first source/drain regions in the semiconductor substrate on opposite sides of the first gate pattern; and
forming second source/drain regions in the semiconductor substrate on opposite sides of the second gate pattern,
wherein
the first gate pattern and the first source/drain regions constitute a first transistor,
the second gate pattern and the second source/drain regions constitute a second transistor, and
thicknesses of the first and second metal-containing layers are controlled to adjust threshold voltages of the first and second transistors.

14. A method of fabricating a semiconductor device, the method comprising:

forming a first gate dielectric layer and a second gate dielectric layer on a first region and a second region that are included in a semiconductor substrate, respectively;

forming a first metal-containing layer on the first and second gate dielectric layers;

forming a mask pattern to cover the first metal-containing layer on the first region;

performing a first annealing process with respect to the first metal-containing layer exposed through the mask pattern;

removing the mask pattern;

forming a second metal-containing layer on the first metal-containing layer;

performing a second annealing process with respect to the second metal-containing layer;

forming a gate electrode layer on the second metal-containing layer;

partially removing the gate electrode layer, the second metal-containing layer, the first metal-containing layer, the first gate dielectric layer, and the second gate dielectric layer to form a first gate pattern and a second gate pattern on the first region and the second region, respectively; and performing a third annealing process after the removing the mask pattern and before the forming the second metal-containing layer.

15. A method of fabricating a semiconductor device, the method comprising:

forming an interlayer dielectric layer on a substrate having a first region and a second region;

forming a first groove and a second groove in the interlayer dielectric layer at the first region and the second region, respectively;

forming a first metal-containing layer in the first groove and the second groove;

performing a first annealing process with respect to the first metal-containing layer;

removing the first metal-containing layer in the first groove;

forming a second metal-containing layer in the first groove and the second groove;

performing a second annealing process with respect to the second metal-containing layer;

partially removing the second metal-containing layer to expose a top surface of the interlayer dielectric layer; and performing a third annealing process after the removing the first metal-containing layer in the first groove and before the forming the second metal-containing layer.

16. The method of claim 15, wherein the partially removing of the second metal-containing layer includes performing a planarization process with respect to the second metal-containing layer and the first metal-containing layer.

17. The method of claim 15, wherein the first metal-containing layer and the second metal-containing layer include titanium nitride (TiN), a tantalum nitride (TaN), a titanium aluminum carbide (TiAlC), aluminum (Al), or lanthanum (La), respectively.

18. The method of claim 15, wherein the first annealing process and the second annealing process includes supplying a reducing gas or an oxidizing gas, respectively.

19. The method of claim 18, wherein the reducing gas includes at least one of hydrogen ($H_2$), nitrogen ($N_2$), and ammonia ($NH_3$) and the oxidizing gas includes at least one of oxygen ($O_2$), ozone ($O_3$), nitrogen monoxide (NO), and nitrogen dioxide ($NO_2$).

* * * * *